United States Patent

Kohno et al.

[11] Patent Number: 6,143,399
[45] Date of Patent: *Nov. 7, 2000

[54] AROMATIC POLYIMIDE FILM

[75] Inventors: Takashi Kohno; Hideaki Okihara; Akinori Otani; Susumu Morishige, all of Yamaguchi, Japan

[73] Assignee: Ube Industries, Ltd., Yamaguchi, Japan

[*] Notice: This patent is subject to a terminal disclaimer.

[21] Appl. No.: 09/184,221

[22] Filed: Nov. 2, 1998

Related U.S. Application Data

[63] Continuation-in-part of application No. 08/810,265, Mar. 3, 1997, Pat. No. 5,830,564.
[51] Int. Cl.[7] .............................. B32B 15/08; B32B 27/06
[52] U.S. Cl. ......................... 428/220; 428/409; 428/416; 428/458; 428/473.5; 528/353
[58] Field of Search ................................. 428/220, 409, 428/458, 473.5, 416; 528/353

[56] References Cited

U.S. PATENT DOCUMENTS

| | | | |
|---|---|---|---|
| 4,778,872 | 10/1988 | Sasaki | 528/176 |
| 5,166,308 | 11/1992 | Kreuz | 528/353 |
| 5,254,412 | 10/1993 | Fujimoto | 428/473.5 |
| 5,374,469 | 12/1994 | Hino | 428/209 |
| 5,593,774 | 1/1997 | Hiroe | 428/343 |

*Primary Examiner*—Patricia A. Short
*Attorney, Agent, or Firm*—Reed Smith Shaw & McClay, LLP

[57] ABSTRACT

An aromatic polyimide film which is favorably employed for preparing a laminate of an aromatic polyimide film, an adhesive layer, and an electroconductive sheet is made of a polyimide prepared from a tetracarboxylic acid component containing at least 15 molar % of biphenyltetracarboxylic acid (or its dianhydride or ester) and an aromatic diamine component containing at least 5 molar % of phenylenediamine, has a specific edge tearing resistance of 11 to 22 kg/20 mm/10 μm, and contains not more than 0.4 weight percent of a volatile component.

7 Claims, 1 Drawing Sheet

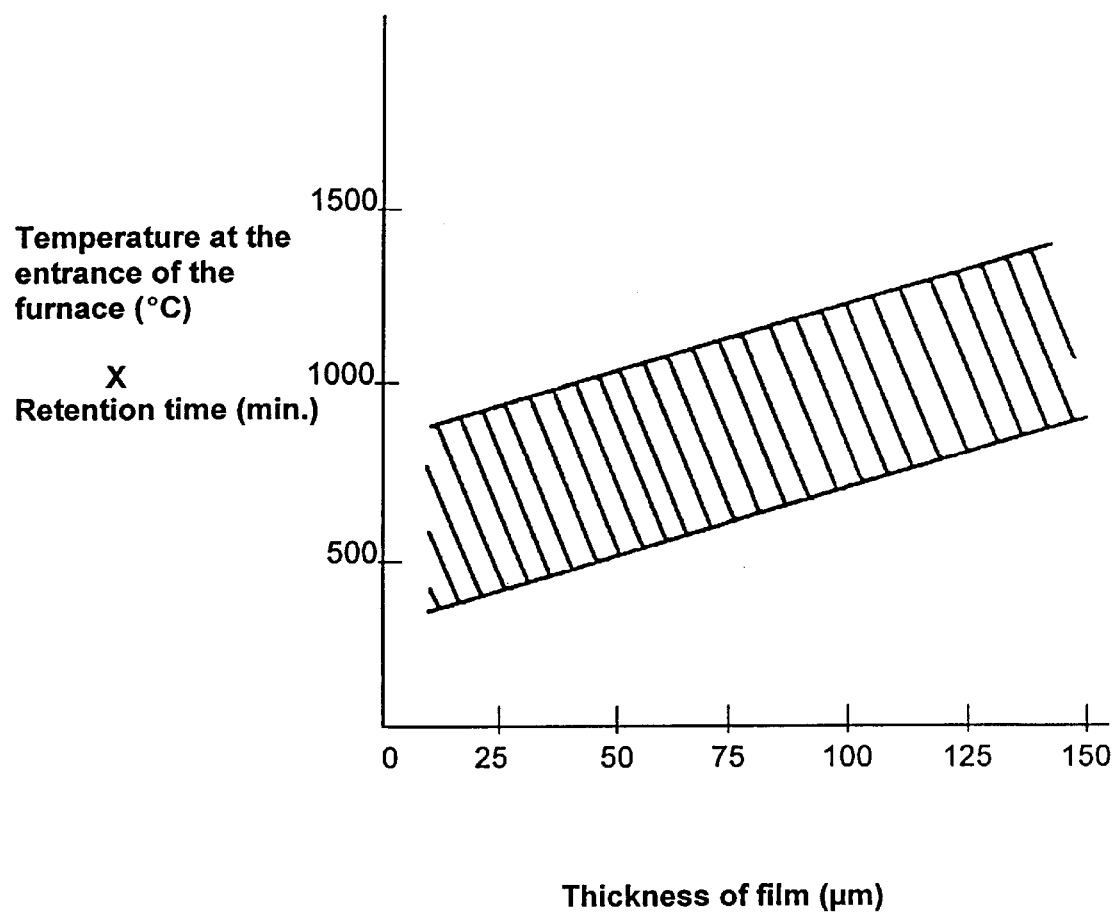

AROMATIC POLYIMIDE FILM

This application is a Continuation-in-Part of Ser. No. 08/810,265, filed Mar. 3, 1997, now U.S. Pat. No. 5,830,564.

FIELD OF THE INVENTION

The present invention relates to an aromatic polyimide film which is favorably employed for preparing a laminate of a polyimide film, an adhesive layer, and an electroconductive film. The invention further relates to a laminate which comprises an aromatic polyimide film, an adhesive layer, and an electroconductive sheet and is favorably employed as a lead frame of an electronic part.

BACKGROUND OF THE INVENTION

An aromatic polyimide film has a high chemical stability, a high physical property, a high electronic insulating property, and a high heat resistance. Therefore, the aromatic polyimide film has been employed in a wide variety of arts. Particularly, the heat resistant aromatic polyimide film is favorably used as a support for an electroconductive sheet in the form of a laminate of an aromatic polyimide film, an adhesive layer and an electroconductive metal sheet such as a lead frame of an electronic part.

An aromatic polyimide film is prepared in the form of a continuous longitudinal film having a large width, while a lead frame of an electronic part generally is a part of a small size having precise dimensions and a punched area with complicated design. Accordingly, the aromatic polyimide film should be cut sharply and precisely with no defective section when the polyimide film is cut or punched.

GB 2,278,497-A (corresponding to U.S. Pat. No. 5,593,774) describes that an insulating polyimide film should have an edge tearing resistance of 50 to 70 kgf/20 mm so that the polyimide film can be cut with little occurrence of burrs and chips. It is further described that the polyimide film should contain a certain amount of a residual solvent so as to give the desired polyimide film having the designated edge tearing resistance.

The present inventors have studied various kinds of aromatic polyimide films and found that the polyimide films described in the above GB patent publication do not give a highly heat-resistant aromatic polyimide film showing both a satisfactory cutting or punching property and a good adhesion to an adhesive layer.

SUMMARY OF THE INVENTION

Accordingly, the present invention has an object to provide an aromatic polyimide film showing not only a high heat resistance and a satisfactory cutting or punching property but also a good adhesion to an adhesive layer.

The invention further has an object to provide a laminate of an aromatic polyimide film, an adhesive layer, and an electroconductive sheet, such as a lead frame, which has high chemical and mechanical properties and is favorably employable as an electronic part.

The present invention resides in an aromatic polyimide film which has a thickness in the range of 10 to 125 $\mu$m and comprises a polyimide prepared from a tetracarboxylic acid component comprising at least 15 molar % of biphenyltetracarboxylic acid or its dianhydride or ester and an aromatic diamine component comprising at least 5 molar % (preferably at least 15 molar %) of phenylenediamine, wherein the polyimide film has a specific edge tearing resistance of 11 to 22 kg/20 mm/10 $\mu$m (preferably 11 to 15 kg/20 mm/10 $\mu$m) and contains not more than 0.4 weight percent (more preferably 0.05 to 0.3 wt. %, most preferably 0.05 to 0.2 wt. %) of a volatile component.

The aromatic polyimide film of the invention preferably has a water absorption of not more than 1.8%, a tensile strength of not lower than 450 kg/mm$^2$, and a coefficient of linear expansion in the temperature range of 50 to 200° C. of not higher than 2.5×10$^{-5}$ cm/cm/° C. It is further preferred that the polyimide film has a dielectric breakdown voltage of not lower than 3 kV and a volume resistivity at 25° C. of not less than 2×10$^{16}$ Ω·cm.

The invention further resides in a laminate comprising an aromatic polyimide film, an adhesive layer, and an electroconductive sheet, wherein the polyimide film has a thickness in the range of 10 to 125 $\mu$m, comprises an aromatic polyimide prepared from a tetracarboxylic acid component comprising at least 15 molar % of biphenyltetracarboxylic acid or its dianhydride or ester and an aromatic diamine component comprising at least 5 molar % of phenylenediamine, has a specific edge tearing resistance of 11 to 22 kg/20 mm/10 $\mu$m and contains not more than 0.4 weight percent of a volatile component.

BRIEF DESCRIPTION OF DRAWING

FIGURE graphically shows a preferred range (shadow area) of heat-treatment conditions in a curing furnace, which is employed for preparing the aromatic polyimide film of the invention. In the graph, the ordinate stands for a value of a product of [temperature (° C.) at the entrance of the curing furnace] and [retention time (min.) in the furnace], and the abscissa stands for the thickness ($\mu$m) of the obtained polyimide film.

DETAILED DESCRIPTION OF THE INVENTION

The aromatic polyimide film of the invention comprises a polyimide prepared from a tetracarboxylic acid component comprising at least 15 molar % of biphenyltetracarboxylic acid or its dianhydride or ester and an aromatic diamine component comprising at least 5 molar % of phenylenediamine.

The biphenyltetracarboxylic acid or its dianhydride or ester can be 2,3,3',4'-biphenyltetracarboxylic acid, its dianhydride or its ester or 3,3',4,4'-biphenyltetracarboxylic acid, its dianhydride or its ester. Preferred is 3,3',4,4'biphenyltetracarboxylic acid dianhydride. The biphenyltetracaboxylic acid or its dianhydride or ester can be employed singly or in combination with one or more of other tetracarboxylic acid components such as pyromellitic acid, 3,3',4,4'-benzophenonetetracarboxylic acid, 2,2',3,3'-benzophenonetetracarboxylic acid, 3,3',4,4'-diphenylethertetracarboxylic acid, 2,2-bis(3,4-dicarboxyphenyl)propane, 2,2-bis(2,3-dicarboxyphenyl)-propane, bis(3,4-dicarboxyphenyl)ether, bis(2,3-dicarboxyphenyl)ether, 2,3,6,7-naphthalenetetracarboxylic acid, 1,4,5,8-naphthalenetetracarboxylic acid, 1,2,5,6-naphthalenetetracarboxylic acid, 2,2-bis(3,4-dicarboxyphenyl)-1,1,1,3,3,3-hexafluoropropane, 2,2-bis(2,3-dicarboxyphenyl)-1,1,1,3,3,3-hexafluoropropane, and their dianhydrides.

The phenylenediamine can be o-phenylenediamine, m-phenylenediamine, or p-phenylenediamine. The phenylenediamine can be employed singly or in combination with one or more of other aromatic diamine components such as 4,4'-diaminodiphenyl ether, 3,3'-diaminodiphenyl ether, 4,4'-diaminodiphenylpropane, 4,4'- diaminodiphenylethane, 4,4'-diaminodiphenylmethane, 4,4'-diaminodiphenylsulfide, bis[4-(4-aminophenoxy)phenyl]methane, 2,2-bis[4-(4-aminophenoxy)phenyl]propane, 2,2-bis[4-(aminophenoxy)phenyl]-1,1,1,3,3,3-hexafluoropropane, and bis[4-(4-aminophenyl]ether.

The polyimide of the invention can be prepared by reacting the tetracarboxylic acid component and the aromatic diamine component in essentially equimolar amounts in a polar organic solvent such as N,N-dimethylacetamide or N-methyl-2-pyrrolidone at 10 to 80° C. for 1 to 30 hours to give a polyamide acid (imidization ratio: not more than 5%), and imidizing the resultant polyamide acid. The polyamide acid (or polyamic acid) preferably has a logarithmic viscosity of 0.1 to 5 (measuring temperature: 30° C., solvent: N-methyl-2-pyrrolidone, concentration: 0.5 g/100 mL), and a rotational viscosity of 500 to 4,500 poise (at 30° C.).

For the imidization, the polyamide acid can be supplied in the form of a solution in which the polyamide acid is dissolved in an organic solvent. A polyamide acid solution which is obtained by the reaction of the tetracarboxylic acid component and the aromatic diamine component can be as such employed for performing the imidization.

The polyamide acid solution can contain 0.01 to 1 weight percent (based on the amount of solid polyamide acid) of a releasing agent such as (poly)phosphoric acid ester or its amine salt, or other organic or inorganic phosphorous compound. The polyamide acid solution also can contain 0.1 to 3 weight percent (based on the amount of solid polyamide acid) of a powdery inorganic filler such as colloidal silica, silicon nitride, talc, titanium dioxide, or potassium phosphate. The powdery inorganic filler preferably has a mean diameter in the range of 0.005 to 5 $\mu$m, more preferably 0.005 to 2 $\mu$m.

For the imidization, the polyamide acid solution can be casted on a continuous metallic support (such as in the form of a belt) having a plane surface to give a casted solution layer. The casted solution layer is then heated to 100 to 160° C. for 1 to 60 minutes so that the solution layer can be dried in part and the polyamide acid can be in part imidized. The heated layer preferably contains a volatile component such as the solvent and water produced by imidization reaction taking place in the heating process, in an amount of 30 to 50 weight % and preferably shows an imidization ratio of 10 to 60%. Thus heated layer turns into a semi-solid continuous film. The semi-solid continuous film is then separated from the support.

The semi-solid continuous film is then heated to higher temperatures so that most of the remaining solvent and water can be removed and enough imidization can take place.

In advance of the heat treatment at higher temperatures, the semi-solid film can be treated on its one surface or both surfaces with a surface-activating agent such as of an aminosilane type, epoxysilane type, or titanate type. Examples of the surface-activating agents include γ-aminopropyltriethoxysilane, N-β-(aminoethyl)-γ-aminopropyltriethoxysilane, N-(aminocarbonyl)-γ-aminopropyltriethoxysilane, N-[β-(phenylamino)ethyl]-γ-aminopropyltriethoxysilane, N-phenyl-γ-aminopropyltriethoxysilane, γ-phenylamino-propyltriemethoxysilane, β-(3,4-epoxycyclohexyl)ethyltrimethoxysilane, γ-glycydoxypropyltrimethoxysilane, isopropyltricumylphenyl titanate, and dicumylphenyloxyacetate titanate. The surface-activating agent can be applied to the surface(s) of the semi-solid film in the form of a solution in a lower alcohol or an amide solvent. The concentration of the surface-activating agent in the solution preferably is in the range of 0.5 to 50 wt. %. The solution can be applied to the surface(s) of the semi-solid film by gravure coating, silk screen coating or dipping method.

The semi-solid film is preferably heated, that is, cured, in a curing furnace under the specifically controlled heating conditions to give the polyimide film having the edge tearing resistance and a less amount of volatile material, which is according to the invention. The controlled heating conditions comprise an initial heating condition, namely, the temperature and period in the entrance area of the heating furnace and the highest heating temperature. The preferred initial heating condition is illustrated in the attached FIGURE by the shadow area. The temperature in the entrance area of the furnace preferably is from 100 to 250° C. The highest temperature in the furnace preferably is from 400 to 500° C., and heating at the highest temperature range is preferably done for 0.5 to 30 minutes. Thus, a cured polyimide film is obtained.

The cured polyimide film can be treated on its surface(s) with alkaline-solution treatment. Such treatment can be done, for instance, using an alkaline sodium hydroxide solution.

The cured continuous polyimide film is preferably heated to 200 to 400° C. under weak or no tension for giving the film stress relaxation.

Thus, the desired aromatic polyimide film having a thickness in the range of 10 to 125 $\mu$m, comprising a polyimide prepared from a tetracarboxylic acid component comprising at least 15 molar % of biphenyltetracarboxylic acid or its dianhydride or ester and an aromatic diamine component comprising at least 5 molar % of phenylenediamine, and further having a specific edge tearing resistance of 11 to 22 kg/20 mm/10 $\mu$m and containing not more than 0.4 weight percent of a volatile component was obtained. The amount of the volatile component in the polyimide film can be determined by measuring a weight loss of the polyimide film after heating to 450° C., for 20 min. In more detail, the amount of the volatile component is defined as follows:

Amount of volatile component=[(A−B)/A]×100 wherein "A" means a weight of the film after drying at 150° C. for 10 min. in air, and "B" means a weight of the film after heating at 450° C. for 20 min. in air.

If an aromatic polyimide film having larger thickness is desired, the polyamide acid solution can be casted in such manner as to give two or more solution layers, and these solution layers can be heated in the same manner to give the desired thick polyimide film.

In the preparation of the polyimide film, a known imidization agent can be employed.

The polyimide film of the invention is favorably employable for the manufacture of a laminate of a polyimide film, an electroconductive layer, and an intervening adhesive layer. Such laminate is advantageous in the use for a lead frame of an electronic part or an electronic circuit. Otherwise, an electroconductive metal layer can be formed directly on the polyimide film by vapor deposition, spattering, or plating.

The obtained polyimide film can be further treated on its surface(s) with corona discharge, ultraviolet rays, glow discharge, plasma, or flame, so that the film can more readily and more reliably receive an adhesive on its surface(s).

The adhesive preferably is a thermoplastic adhesive or a thermosetting adhesive. Examples of the preferred adhesives include a polyimide adhesive and an epoxy resin adhesive. The adhesive can be coated on the surface of the polyimide film or an adhesive tape or film can be employed.

The electroconductive material can be gold, aluminum, copper, or copper alloy. Generally, a copper foil is used for the formation of the electroconductive layer. The copper foil is an electrolytic copper foil or calendared copper foil. The copper foil preferably has a thickness of 8 to 50 μm, and tensile strength of not lower than 17 kg/mm².

As described above, the laminate of the polyimide film of the invention, an adhesive layer, and an electroconductive layer can be favorably employed for the manufacture of an electronic circuit or a lead frame of an electronic part. The manufacture can be performed in the known way.

The present invention is further described by the following non-limitative examples.

EXAMPLE 1

In 100 L-volume vessel, 54.6 kg of N,N-dimethylacetamide, 8.826 kg of 3,3',4,4'-biphenyltetracarboxylic acid dianhydride, and 3.243 kg of p-phenylenediamine were placed and mixed. The mixture was heated to 30° C. for 10 hours to give a polyamide acid solution containing 18 wt. % of polyamide acid (imidization ratio: not more than 5%, logarithmic viscosity: 1.60, at 30° C., 0.5 g in 100 mL of N,N-dimethylacetamide).

The obtained polyamide acid solution was stirred uniformly after addition of 0.1 weight part of monostearylphosphoric acid ester triethanolamine salt and 0.5 weight part of colloidal silica (mean particle diameter: 0.08 μm). The weight part was based on 100 weight parts of the solid polyamide acid. Thus treated polyamide acid solution had a rotational viscosity of 3,000 poise.

The polyamide acid solution was continuously extruded from a slit of a T-die and cased onto a continuous metal sheet and dried at an average temperature of 141° C. Thus, a semi-solid continuous film was formed. The semi-solid film was then separated from the metal sheet.

A solution of an aminosilane coupling agent in N,N-dimethylacetamide was coated on both surfaces of the semi-solid film and dried. Thus treated semi-solid film contains 27 wt. % of volatile components which included a remaining solvent and water produced in the reaction.

The imidization ratio and the amount of the remaining volatile components were determined by the following methods:

Imidization ratio:
Obtained by calculating a ratio of absorbance at 1780 cm$^{-1}$ and 1510 cm$^{-1}$ which was according to FI-IR (ATR method).

Amount of remaining volatile component in the semi-solid film:
The amount of volatile component is obtained according to the following formula:
Amount of volatile component=[(A−B)/A]×100
wherein "A" means a weight of the film before heating, and "B" means a weight of the film after heating at 420° C. for 20 min.

The surface-treated semi-solid film was tentered and heated in a curing furnace under the following conditions:

| Temperature in the entrance area: | 240° C. |
| --- | --- |
| Retention time in the entrance area: | 2 min. |
| Highest temperature: | 480° C. |
| Retention at the highest temperature: | 1 min. |

Thus, an aromatic polyimide film having been treated with a surface-activating agent on both surfaces and a thickness of 25 μm had been obtained.

EXAMPLE 2

The procedures of Example 1 were repeated except for employing a T-die having a different slit clearance to give a semi-solid continuous film. The semi-solid film was not coated on its surfaces with a surface-activating agent. The obtained semi-solid film contains 27 wt. % of volatile components which included a remaining solvent and water produced in the reaction.

The non-surface-treated semi-solid film was tentered and heated in a curing furnace under the following conditions:

| Temperature in the entrance area: | 200° C. |
| --- | --- |
| Retention time in the entrance area: | 4 min. |
| Highest temperature: | 480° C. |
| Retention at the highest temperature: | 3 min. |

Thus, an aromatic polyimide film having a thickness of 50 μm had been obtained.

EXAMPLE 3

The procedures of Example 2 were repeated except for coating the semi-solid film with a surface-activating agent in the same manner as in Example 1. The obtained surface-treated semi-solid film contains 28 wt. % of volatile components which included a remaining solvent and water produced in the reaction.

The surface-treated semi-solid film was tentered and heated in a curing furnace under the following conditions:

| Temperature in the entrance area: | 200° C. |
| --- | --- |
| Retention time in the entrance area: | 2.5 min. |
| Highest temperature: | 480° C. |
| Retention at the highest temperature: | 3 min. |

Thus, an aromatic polyimide film having been treated with a surface-activating agent on both surfaces and a thickness of 50 μm had been obtained.

EXAMPLE 4

The procedures of Example 1 were repeated except for employing a T-die having a different slit clearance to give a semi-solid continuous film. The semi-solid film was not coated on its surfaces with a surface-activating agent. The obtained semi-solid film contains 30 wt. % of volatile components which included a remaining solvent and water produced in the reaction.

The non-surface-treated semi-solid film was tentered and heated in a curing furnace under the following conditions:

| Temperature in the entrance area: | 140° C. |
| --- | --- |
| Retention time in the entrance area: | 5 min. |
| Highest temperature: | 480° C. |
| Retention at the highest temperature: | 3 min. |

Thus, an aromatic polyimide film having a thickness of 75 μm had been obtained.

The polyimide film was then dipped in a 30% aqueous sodium hydroxide solution for 30 minutes, taken out of the solution, washed with water, and dried. Thus alkali-treated polyimide film was then treated with a surface-activating agent in the same manner as in Example 1, to give a surface-treated polyimide film.

EXAMPLE 5

The procedures of Example 1 were repeated except for employing a T-die having a different slit clearance to give a semi-solid continuous film. The semi-solid film was not coated on its surfaces with a surface-activating agent. The obtained semi-solid film contains 30 wt. % of volatile components which included a remaining solvent and water produced in the reaction.

The non-surface-treated semi-solid film was tentered and heated in a curing furnace under the following conditions:

| | |
|---|---|
| Temperature in the entrance area: | 105° C. |
| Retention time in the entrance area: | 9 min. |
| Highest temperature: | 450° C. |
| Retention at the highest temperature: | 15 min. |

Thus, an aromatic polyimide film having a thickness of 75 μm had been obtained.

EVALUATION OF POLYIMIDE FILM

1) The polyimide film obtained in each of Examples 1 to 5 was cut using a sharp cutter, and its section was observed. It was confirmed that all of the polyimide film were neatly cut and a plane and straight section was formed.

2) The polyimide film was subjected to measurements of the following physical properties, the content of remaining volatile component, and water absorption. The measurements were done according to the standard measuring methods set forth below:

Water absorption: ASTM D570-63 (23° C., 24 hours)

Tensile modulus: ASTM D882-64T (MD)

Coefficient of linear expansion:

A specimen was heated at 300° C. for 30 minutes to give stress relaxation and measured by means of TMA measuring apparatus (drawing mode, 20° C./min., load: 2 g, length of specimen: 10 mm)

Dielectric breakdown voltage: ASTM D-149-64 (25° C.)

Volume resistivity: ASTM D-257-61 (25° C.)

Dielectric constant: ASTM D150-64T (25° C., 1 kHz)

Edge tearing resistance (E.T.R.):

JIS C2318 (mean value on five specimens)

Amount of volatile component in the polyimide film= $[(A-B)/A] \times 100$ wherein "A" means a weight of the film after drying at 150° C. for 10 min. in air, and "B" means a weight of the film after heating at 450° C. for 20 min. in air.

The results of the measurements are set forth in Table 1.

TABLE 1

| | Example | | | | |
|---|---|---|---|---|---|
| | No. 1 | No. 2 | No. 3 | No. 4 | No. 5 |
| Thickness (μm) | 25 | 50 | 50 | 75 | 75 |
| Surface treat. | treated | none | treated | treated | none |
| E.T.R. (kg/20 mm) | 32 | 68 | 67 | 84 | 93 |
| Specific E.T.R. (kg/20 mm/10 μm) | 12.8 | 13.6 | 13.4 | 11.2 | 12.4 |
| Volatile amount (wt. %) | 0.11 | 0.14 | 0.17 | 0.30 | 0.34 |
| Water absorp. (wt. %) | 1.27 | 1.34 | 1.35 | 1.20 | 1.35 |
| Tensile modulus (kg/mm²) | 847 | 857 | 850 | 690 | 710 |

TABLE 1-continued

| | Example | | | | |
|---|---|---|---|---|---|
| | No. 1 | No. 2 | No. 3 | No. 4 | No. 5 |
| Coeffi. of linear expan. (×10⁻⁵/° C.) | 1.20 | 1.14 | 1.23 | 2.10 | 1.95 |
| Dielect. breakdown C. (kV) | 6.6 | 10.4 | 10.3 | 9.8 | 9.6 |
| Vol. resitivity (×10¹⁶Ω · cm) | 3.8 | 4.7 | 3.6 | 2.4 | 4.5 |
| Dielectric C. (1 kHz) | 2.95 | 3.03 | 3.10 | 3.00 | 3.05 |
| Heat shrinkage (%) | <0.3 | <0.3 | <0.3 | <0.3 | <0.3 |

MANUFACTURE OF LAMINATE

The polyimide film of each of Examples 1, 3 and 4 and an electrolytic copper foil (thickness: 35 μm) were combined under pressure (170° C., 40 kg/cm², 5 min.) using an epoxy resin adhesive, to give a laminate of a polyimide film, an adhesive layer, and a copper film.

The polyimide film of each of Examples 2 and 5 was subjected to plasma treatment, and then combined with an electrolytic copper foil (thickness: 35 μm) under pressure (170° C., 40 kg/cm², 5 min.) using an epoxy resin adhesive, to give a laminate of a polyimide film, an adhesive layer, and a copper film.

The resulting laminate had such a high peel resistance as higher than 2 kg/cm (180° peel).

What is claimed is:

1. An aromatic polyimide film which has a thickness in the range of 10 to 125 μm and comprises a polyimide prepared from a tetracarboxylic acid component and an aromatic diamine component comprising at least 5 molar % of phenylenediamine, wherein the polyimide film has a specific edge tearing resistance of 11 to 20 kg/20 mm/10 μm, a tensile modulus of not lower than 450 kg/mm², and a coefficient of linear expansion in the temperature range of 50 to 200° C. of not higher than 2.5×10⁻⁵ cm/cm/° C.

2. The aromatic polyimide film of claim 1 wherein the film has a dielectric breakdown voltage of not lower than 3 kV and a volume resistivity at 25° C. of not less than 2×10¹⁶Ωcm.

3. A laminate comprising an aromatic polyimide film, an adhesive layer, and an electroconductive sheet, wherein the aromatic polyimide film has a thickness in the range of 10 to 125 μm and comprises a polyimide prepared from a tetracarboxylic acid component and an aromatic diamine component comprising at least 5 molar % of phenylenediamine, wherein the polyimide film has a specific edge tearing resistance of 11 to 20 kg/20 mm/10 μm, a tensile modulus of not lower than 450 kg/mm², and a coefficient of linear expansion in the temperature range of 50 to 200° C. of not higher than 2.5×10⁻⁵ cm/cm° C.

4. The laminate of claim 3 wherein the adhesive layer comprises a thermoplastic resin.

5. The laminate of claim 3 wherein the adhesive layer comprises a polyimide adhesive or an epoxy resin.

6. The laminate of claim 3 wherein the polyimide film has been treated on its surface by coating a silane coupling agent thereon or by applying corona discharge, ultraviolet rays, glow discharge, plasma, or flame onto its surface.

7. The laminate of claim 3 which shows a 180° peel resistance of higher than 2 kg/cm.

* * * * *